(12) United States Patent
Aoki et al.

(10) Patent No.: US 8,587,008 B2
(45) Date of Patent: Nov. 19, 2013

(54) LIGHT-EMITTING DEVICE

(75) Inventors: Dai Aoki, Tokyo (JP); Makoto Ida, Tokyo (JP); Shigehiro Kawaura, Tokyo (JP)

(73) Assignees: Stanley Electric Co., Ltd., Tokyo (JP); Nippon Carbide Industries Co., Inc., Tokyo (JP)

( * ) Notice: Subject to any disclaimer, the term of this patent is extended or adjusted under 35 U.S.C. 154(b) by 97 days.

(21) Appl. No.: 13/273,526

(22) Filed: Oct. 14, 2011

(65) Prior Publication Data

US 2012/0091480 A1    Apr. 19, 2012

(30) Foreign Application Priority Data

Oct. 15, 2010  (JP) .................................. 2010-232429

(51) Int. Cl.
*H01L 33/00*    (2010.01)
*H01L 23/58*    (2006.01)

(52) U.S. Cl.
USPC ................... 257/98; 257/81; 257/88; 257/99; 257/228; 257/290; 257/633; 257/634; 257/644; 257/650; 257/E33.001

(58) Field of Classification Search
USPC ......... 257/81, 88, 98, 99, 228, 290, 633, 634, 257/644, 650, E33.001
See application file for complete search history.

(56) References Cited

U.S. PATENT DOCUMENTS

| 6,633,351 | B2 * | 10/2003 | Hira et al. ........................ 349/95 |
| 2004/0238838 | A1 * | 12/2004 | Fujisawa et al. .............. 257/100 |
| 2009/0114928 | A1 * | 5/2009 | Messere et al. ................. 257/88 |
| 2010/0110334 | A1 * | 5/2010 | Oki et al. ......................... 349/62 |

FOREIGN PATENT DOCUMENTS

| JP | 2006-324134 A | 11/2006 |
| JP | 2010-129923 A | 6/2010 |

* cited by examiner

*Primary Examiner* — Michelle Mandala
(74) *Attorney, Agent, or Firm* — Holtz, Holtz, Goodman & Chick, PC (57) ABSTRACT

A light-emitting device includes a substrate, a plurality of light-emitting elements mounted on one surface of the substrate, a first glass film provided to one surface of the substrate and having a plurality of apertures that form a light-reflecting frame surrounding the perimeter of each the light-emitting elements, and a second glass film provided to the other surface of the substrate. A coefficient of thermal expansion of the second glass film is greater than that of the substrate when a coefficient of thermal expansion of the first glass film is greater than that of the substrate, and a coefficient of thermal expansion of the second glass film is less than that of the substrate when a coefficient of thermal expansion of the first glass film is less than that of the substrate.

11 Claims, 7 Drawing Sheets

LIGHT-EMITTING DEVICE

BACKGROUND OF THE INVENTION

1. Field of the Invention

The present invention relates to a light-emitting device, and particularly relates to a high-flux (high-power) light-emitting device in which a plurality of LED (light-emitting diode) elements are mounted on a substrate.

2. Description of the Related Art

With the recent increase in awareness toward environmental protection, high-flux (high-power) light-emitting devices in which LED elements are mounted are being used in various illumination devices instead of incandescent light bulbs and fluorescent lights.

Examples of high-flux light-emitting devices include those in which comparatively large-size and high-power LED elements are mounted, and those in which high output can be obtained by mounting a plurality of comparatively small-size and small-power LED elements. The latter are often more advantageous in terms of diffusing the heat source and electric current, luminous efficiency, and the cost per element surface area.

There is disclosed in Patent Document 1 (JP-A 2006-324134) a planar light-emitting device configured by arranging LED packages having a single LED element in an array on a packaging substrate (i.e., light-emitting device mounting substrate).

There is disclosed in Patent Document 2 (JP-A 2010-129923) a luminaire comprising a plurality of LED elements mounted on an element-mounting substrate, a frame-shaped reflector provided so as to enclose all of the LED elements on the element-mounting substrate, and a phosphor-containing resin layer packed into the reflector to encapsulate the LED elements.

SUMMARY OF THE INVENTION

The distance between adjacent LED elements necessarily increases in a structure in which LED packages in which a single LED is mounted are arrayed on a packaging substrate (i.e., light-emitting device mounting substrate), such as in the structure shown in Patent Document 1. Accordingly, a problem arises in which color mixture properties is degraded in cases in which various LED elements emitting mutually different luminescent colors or various phosphors having different wavelength conversion characteristics are used to mix luminescent colors.

The phosphor-containing resin in between each of the LED elements exerts a negative influence on the optical output in a structure in which a plurality of LED elements are mounted on an element-mounting substrate and the entire LED element is integrally covered by a phosphor-containing resin, such as in the structure shown in Patent Document 2. Specifically, the difference in optical path length within the phosphor-containing resin layer increases between light transmitting in the vertical direction with respect to the light emission surface and light transmitting in a direction inclined with respect to the light emission surface, and color irregularities in the luminescent color easily occur. For example, light that transmits through the phosphor-containing resin layer in a direction inclined with respect to the light emission surface to be radiated to the outside becomes white tinged with yellow in cases in which a blue LED and a phosphor that receives blue light and then emits yellow light are used to obtain a white light. Moreover, light absorption by phosphor-containing resin in between the LED elements occurs, resulting in reduced luminous efficiency. It is thus difficult to obtain the desired optical output in a structure in which a plurality of LED elements are entirely and integrally covered by a phosphor-containing resin layer.

Warping of the element-mounting substrate that is induced due to differences in the coefficient of thermal expansion between the element-mounting substrate and the structure on the element-mounting substrate becomes a problem in cases in which a reflector or other structure is mounted on the element-mounting substrate. The bonding properties between the element-mounting substrate and the packaging substrate (or heat dissipation plate) is degraded when warping is induced on the element-mounting substrate in cases in which the element-mounting substrate is mounted on the packaging substrate via for example, silicone grease or another bonding material. As a result, the heat dissipation properties decrease, and the luminous efficiency decreases because the junction temperature of the LED elements increases. The service life of the LED element is also shortened. Moreover, the heat dissipation properties become non-uniform when warping is induced on the element-mounting substrate, and there are concerns that brightness irregularities will occur among the LED elements. This problem of warping of the element-mounting substrate becomes more prominent as the surface area of the element-mounting substrate increases.

An object of the present invention, which was perfected by taking the aforementioned points into consideration, is to achieve good color mixture properties in cases in which a plurality of luminescent colors are mixed together in a light-emitting device in which a plurality of light-emitting elements are mounted on an element-mounting substrate. Another object of the present invention is to resolve problems with color irregularities in the luminescent color and improve the luminous efficiency in cases in which phosphor or another wavelength conversion material is used. A further object of the present invention is to provide a light-emitting device capable of minimizing or eliminating warping of an element-mounting substrate caused by the difference in the coefficient of thermal expansion of the element-mounting substrate and a structure (reflector or the like) formed on the surface thereof.

A light-emitting device of the present invention comprises a substrate having conductor wiring, a plurality of light-emitting elements mounted on one surface of the substrate and electrically connected to the conductor wiring, a first glass film provided to one surface of the substrate and configured to have a plurality of apertures that form a light-reflecting frame surrounding each of the light-emitting elements, and a second glass film provided to the other surface of the substrate; wherein a coefficient of thermal expansion of said second glass film is greater than that of said substrate when a coefficient of thermal expansion of said first glass film is greater than that of said substrate, and a coefficient of thermal expansion of said second glass film is less than that of said substrate when a coefficient of thermal expansion of said first glass film is less than that of said substrate.

According to the light-emitting device of the present invention, good color mixture properties can be achieved in cases in which a plurality of luminescent colors are mixed together. In addition, problems with color irregularities in the luminescent color can be resolved and the luminous efficiency can be improved in cases in which phosphor or another wavelength conversion material is used. Moreover, warping of an element-mounting substrate caused by the difference in the coefficient of thermal expansion between the element-mounting substrate and a structure (reflector or the like) formed on the surface thereof can be minimized or eliminated. The bonding properties between the element-mounting substrate and the packaging substrate (i.e., light-emitting device mounting substrate) can thereby be improved, and the good heat dissipation properties can be ensured.

DETAILED DESCRIPTION OF THE INVENTION

Embodiments of the present invention will be described below with reference to the drawings. In the drawings cited below, the same reference numerals are given to substantially the same or equivalent components and parts.

Embodiment 1

Figure 1A:
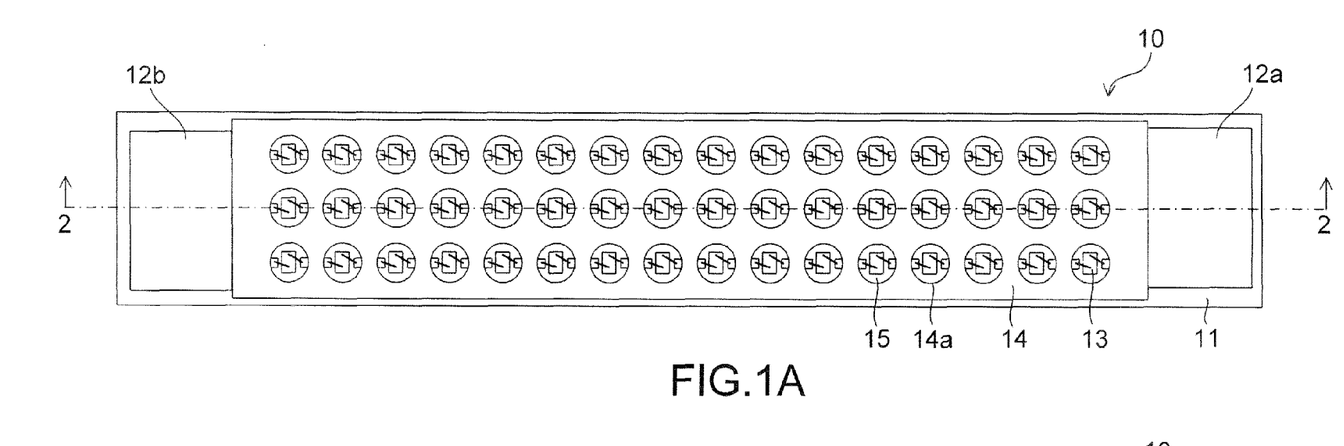
FIG. 1A is a plan view showing the structure of a light-emitting device according to an embodiment of the present invention.
Figure 1B:
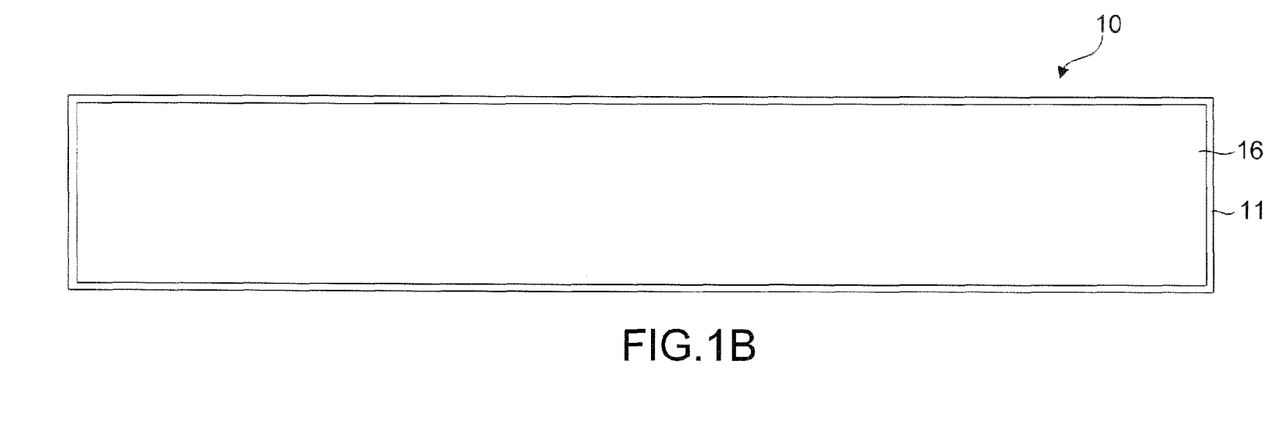
FIG. 1B is a bottom view.

FIG. 1A is a plan view seen from the light emission surface of a light-emitting device 10 according to a first embodiment of the present invention, and FIG. 1B is a bottom view seen from the rear surface.

A rectangular alumina ceramic substrate can be used as an element-mounting substrate 11. Conductor wiring 12 and two feeder terminals 12a and 12b connected to the conductor wiring 12 are formed on the element-mounting surface of the element-mounting substrate 11. The feeder terminals 12a and 12b correspond to an anode terminal and a cathode terminal, respectively, and are disposed on both end of the element-mounting surface of the element-mounting substrate 11. The element-mounting substrate 11 has an element-mounting region for mounting a plurality of LED elements 13 on the element-mounting surface.

Figure 3:
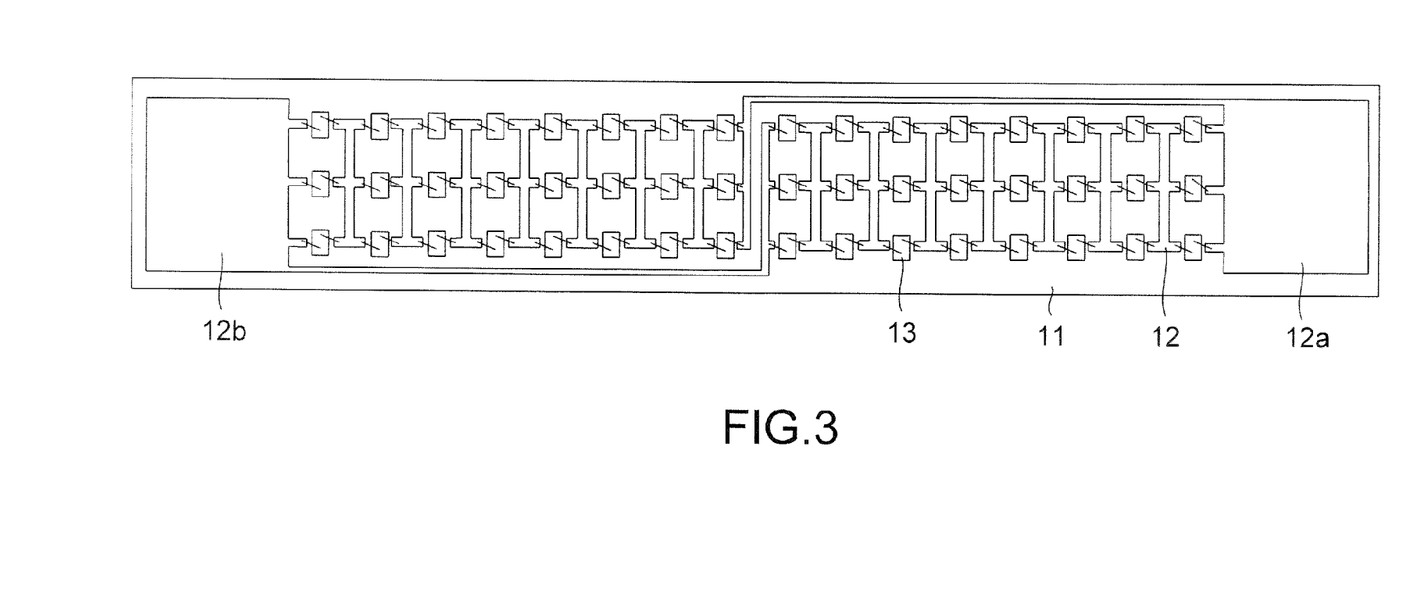
FIG. 3 is a plan view showing the structure of conductor wiring on an element-mounting substrate in the light-emitting device according to an embodiment of the present invention.
Figure 4:
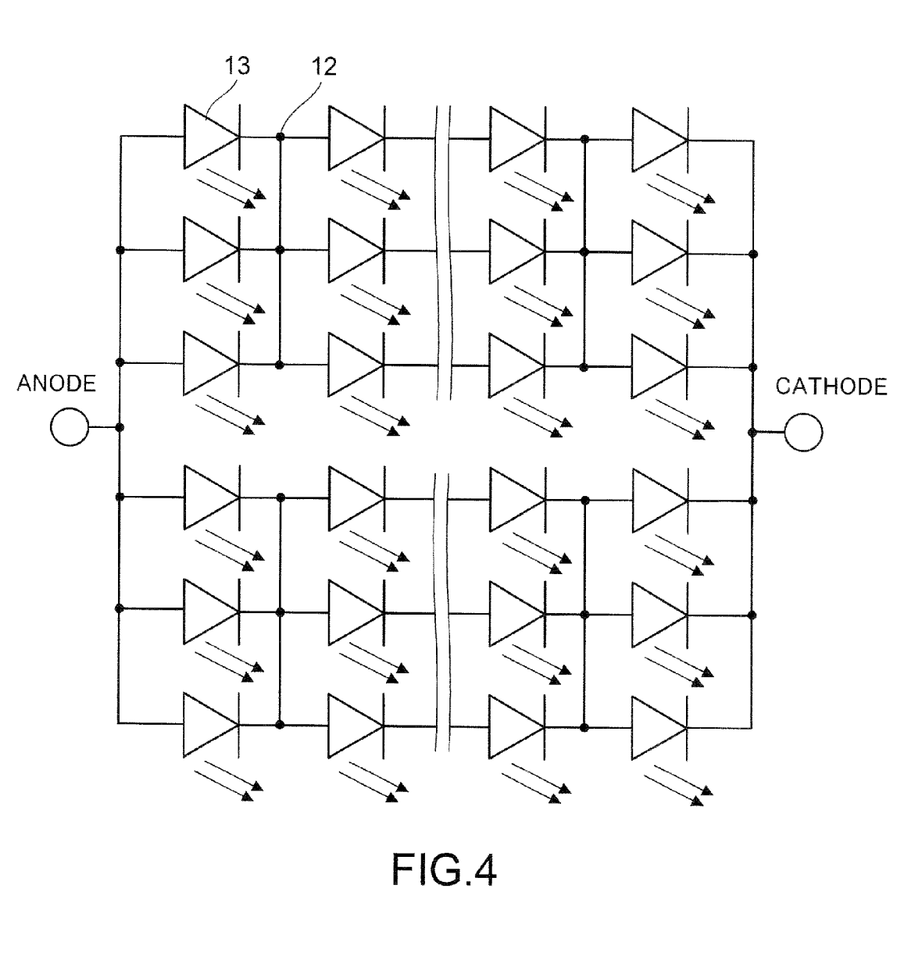
FIG. 4 is an equivalent circuit diagram of the light-emitting device according to an embodiment of the present invention.

The plurality of LED elements 13 are mounted on the element-mounting substrate 11 in rows and columns. Each of the LED elements 13 can be fixed on the element-mounting substrate 11 using, for example, a thermosetting resin adhesive or the like, and can be electrically connected to the conductor wiring 12 by a bonding wire 17. FIG. 3 is a plan view showing a wiring pattern of the conductor wiring 12 on the element-mounting substrate 11. FIG. 4 is an equivalent circuit diagram showing the circuit structure of the light-emitting device 10 realized by the wiring pattern. Forty-eight LED elements 13 can be connected to each other by the conductor wiring 12 in a state in which two 3×8 matrix connections are arranged side-by-side. Each of the LED elements 13 is a small- or medium-power light-emitting element that is, for example, 1.0 mm or less on a side, and blue LED elements containing a GaN-type semiconductor layer can be used.

Figure 2:
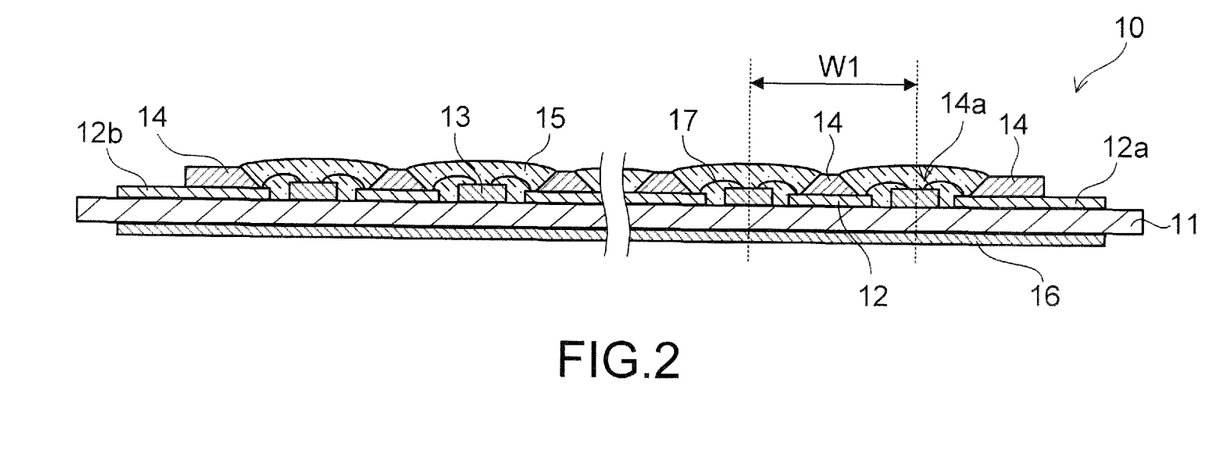
FIG. 2 is a cross-sectional view along line 2-2 in FIG. 1A.

A reflector 14 (first glass film) can be formed of a substance containing titanium oxide ($TiO_2$), barium sulfate ($BaSO_4$), or the like as the light-scattering particles in, for example, a borosilicate glass or other glass material. The reflector 14 has a plurality of apertures 14a for forming light-reflecting frame that surrounds the perimeter of each of the LED elements 13. Specifically, the apertures 14a are provided corresponding to each of the LED elements 13. The reflector 14 is formed by, for example screen printing and firing, and is directly joined to the element-mounting surface of the element-mounting substrate 11. The thickness in the light-projecting direction of the glass film that forms the reflector 14 can be set at, for example, about 420 μm, and can be made greater than the thickness of the LED elements 13 in the light-projecting direction. Specifically, the upper surface of the reflector 14 is positioned higher than the upper surface of the LED elements 13. The area above the feeder terminals 12a, 12b is not covered by the glass film that forms the reflector 14; it is exposed.

The side wall of the apertures 14a of the reflector 14 is inclined so that the angle of the wall with the element-mounting surface is about 45°, and each of the apertures 14a has a "mortar shape." In other words, the diameter of the apertures 14a increases along the light-projecting direction. The reflector 14 forms the light-reflecting frame and defines the light-emitting regions. Specifically, light emitted from the LED elements 13 and spread toward the side is reflected by the light-reflecting frame, and directed toward the front in the light-projecting direction. The distance W1 between mutually adjacent apertures 14a (i.e., distance between mutually adjacent LED elements 13) can be set to, for example, 2.8 mm.

An encapsulation resin 15 is packed into each of the apertures 14a of the reflector 14, and is formed so that the LED elements 13 and the bonding wire 17 are buried in the encapsulation resin 15 in the apertures 14a. A light-transmissive silicone resin, an epoxy resin, a urethane resin, or the like can be used as the encapsulation resin 15. A YAG:Ce phosphor obtained by introducing Ce (cerium) as an activator into YAG (yttrium/aluminum/garnet: $Y_3Al_5O_{12}$), for example, can be dispersed in the encapsulation resin 15. The phosphor absorbs, for example, blue light having a luminescence peak of about 460 nm emitted from the LED elements 13, and converts the blue light to yellow light having a luminescence peak of about 560 nm. In this case, white light is emitted from the light emission surface of the light-emitting device 10 by mixing yellow light converted by the phosphor and blue light transmitted through the encapsulation resin 15 without wavelength conversion.

The surface (hereinafter referred to as "rear surface") which is opposite side of the element-mounting surface of the element-mounting substrate 11 can be a packaging surface when the light-emitting device 10 is packaged on a packaging substrate (i.e., light-emitting device mounting substrate) or a heat dissipation plate. In this case, the conductor wiring and the feeder terminals are not provided on the rear surface of the element-mounting substrate 11. A rear surface glass (second glass film) 16 is provided on the rear surface of the element-mounting substrate 11 so as to extend over substantially the entire region of the rear surface. A glass material having the same coefficient of thermal expansion as the glass material that forms the reflector 14 is preferably used as the rear surface glass 16, and a glass material having the same composition as the glass material that forms the reflector 14 is more preferable. The thickness of the rear surface glass 16 can be less than the thickness of the glass film that forms the reflector 14, and can, for example, be 150 μm.

The rear surface glass 16 has an effect of suppressing warping of the element-mounting substrate 11. Specifically, the element-mounting substrate 11 is composed of alumina ceramic and has a coefficient of thermal expansion that is different from that of the glass film that forms the reflector 14 provided to the element-mounting surface. When heat is applied in a condition in which materials having mutually different coefficients of thermal expansion are bonded, warping is induced on these materials because the material having a lower coefficient of thermal expansion cannot follow the thermal expansion of the other material having a higher coefficient of thermal expansion. The coefficient of thermal expansion of the reflector 14 is higher than the coefficient of thermal expansion of the element-mounting substrate 11, and therefore warping can be induced such that the element-mounting surface bends convexly in cases in which the rear surface glass 16 is not formed. When warping is induced on the element-mounting substrate 11 in cases in which the element-mounting substrate 11 is used by being joined to a packaging substrate or a heat dissipation plate, the heat dissipation properties are deteriorated because of degraded bonding properties between the element-mounting substrate 11 and the packaging substrate or a heat dissipation plate. Deterioration in the heat dissipation properties is the principal cause for reduction in luminous efficiency and for brightness irregularities among the LED elements, and is also the principal cause for the shortening of service life of the LED elements 13. A rear surface glass 16 having the same level of coefficient of thermal expansion as does the glass film that forms the reflector 14 is also formed on the rear surface of the element-mounting substrate 11, as in the present embodiment, whereby warp-inducing stress is produced on both surfaces of the element-mounting substrate 11. As a result, the stresses are cancelled out, and warping of the element-mounting substrate 11 can be minimized or prevented. The composition, thickness, and surface area of the second glass film are adjusted so that the magnitude correlation of the coefficient of thermal expansion of the second glass film that forms the rear surface glass 16 relative to the element-mounting substrate 11 corresponds to the magnitude correlation of the coefficient of thermal expansion of the first glass film that constitutes the reflector 14 relative to the element-mounting substrate 11 in order to cancel out the stresses. When the coefficient of thermal expansion of the reflector 14 is higher than the coefficient of thermal expansion of the element-mounting substrate 11, a glass material having a higher coefficient of thermal expansion than that of the element-mounting substrate 11 is used as the rear surface glass 16, and vice versa.

The rear surface glass 16 is provided to the packaging surface, and because of the need to ensure the good heat dissipation properties, it is preferable that the rear surface glass 16 be as thin as possible while still being capable of preventing the element-mounting substrate from being warped. Specifically, 40 to 200 μm is preferable, and 50 to 190 μm is more preferable. In the present embodiment, the thickness of the rear surface glass 16 can be reduced by making an area in which the second glass film covers the element-mounting substrate 11 greater than an area in which the first glass film covers the element-mounting substrate 11. In the present embodiment, while the reflector 14 has a plurality of apertures 14a and the feeder terminals 12a, 12b are not covered by the first glass film that constitutes the reflector 14, the second glass film that forms the rear surface glass 16 is formed over substantially the entire rear surface of the element-mounting substrate 11. Therefore the area in which the second glass film covers the element-mounting substrate 11 is greater than the surface area in which the first glass film covers the element-mounting substrate 11.

In addition, the surface of the rear surface glass 16 is preferably flat, and the surface roughness is preferably 10 μm or less. In cases in which bonding material 32 such as silicone grease, a heat dissipation sheet or the like is interposed between the rear surface glass 16 and the packaging substrate or the heat dissipation plate to join the element-mounting substrate 11 to the packaging substrate or the heat dissipation plate, the formation of gaps between the bonding material 32 and the rear surface glass 16 is prevented, the bonding properties between the rear surface glass 16 and the packaging substrate or the heat dissipation plate is improved, and good heat dissipation properties are obtained by keeping the rear surface glass 16 flat. The rear surface glass 16 can be made into a flat surface by, for example, performing multiple firing.

A method for manufacturing the light-emitting device 10 according to an embodiment of the present invention will be described next with reference to FIGS. 5A to 5E.

Figure 5A:
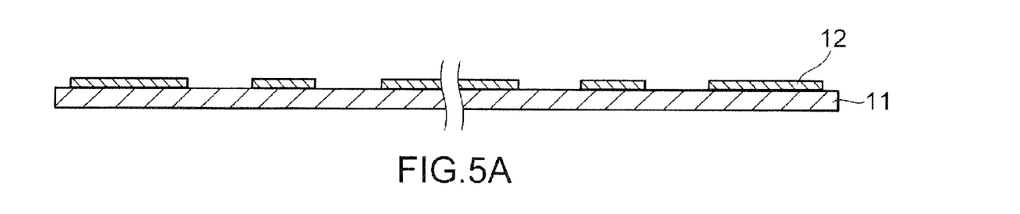
FIGS. 5A to 5E are views showing the method for manufacturing the light-emitting device according to an embodiment of the present invention.

First, a fired alumina ceramic substrate, which will be the base material of the element-mounting substrate 11, is prepared. The alumina ceramic substrate may be perforated or the like as necessary prior to firing. A conductive paste, which will be the material for the conductor wiring 12 and the feeder terminals 12a, 12b, is subsequently prepared. The conductive paste is produced by dispersing a metal powder, which is the principal ingredient for forming a conductor, and various additives (inorganic binder, glass frit, filler, and the like), which are added as necessary, in an organic medium (vehicle). The conductive paste is printed on the surface of the alumina ceramic substrate by screen printing or another general method. The conductor wiring 12 having a specified wiring pattern and the feeder terminals 12a, 12b are then formed on the alumina ceramic substrate by being fired at an appropriate temperature to obtain the element-mounting substrate 11 (FIG. 5A).

Figure 5B:
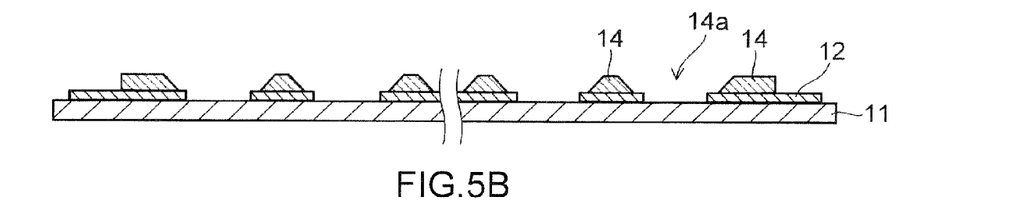

Next, the reflector 14 is formed on the element-mounting surface of the element-mounting substrate 11. A glass paste, which is the material for the reflector 14, is prepared. The glass paste is produced by dispersing a glass powder in which the principal ingredients are $SiO_2$, $B_2O_3$, $Al_2O_3$, and the like, and titanium oxide ($TiO_2$), barium sulfate ($BaSO_4$), or other light-scattering particles in an organic medium (vehicle). The glass paste is printed and coated on the element-mounting surface of the element-mounting substrate 11 by screen printing. A mesh mask having a plurality of round shielding parts that correspond to the apertures 14a of the reflector 14 can be used during the screen printing. The glass plate is then fired at an appropriate temperature. The glass film that forms the reflector 14 can be obtained by alternating printing and firing until the desired thickness is attained. During the multiple printing, several kinds of mesh masks are used. These mesh masks are different in diameters of the shielding parts from each other. The mesh mask having larger shielding parts is used as the number of times of printing proceeds. In other words, the glass films can be progressively layered so that the diameter of the apertures 14a increases toward the light-projecting direction. A reflector 14 in which the side walls of the apertures 14a have a mortar-shaped incline can thereby be formed. The reflector 14 is formed of a glass film having a thickness of 420 μm (FIG. 5B).

Figure 5C:
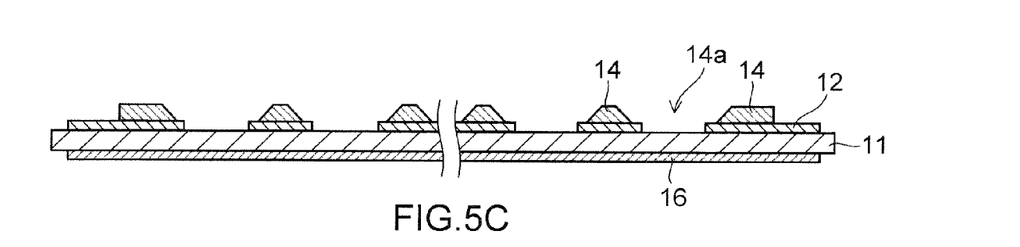

The rear surface glass 16 is then formed on the rear surface of the element-mounting substrate 11. The rear surface glass 16 may be formed by screen printing and firing a glass paste having the same components as the reflector 14. The printing and firing may be carried out several times until the rear surface glass 16 has the desired thickness (for example, 150 µm). The repeated firing can produce a smooth flat surface on the rear surface glass 16. The rear surface glass 16 can be formed so as to extend over substantially the entire rear surface of the element-mounting substrate 11 (FIG. 5C).

Figure 5D:
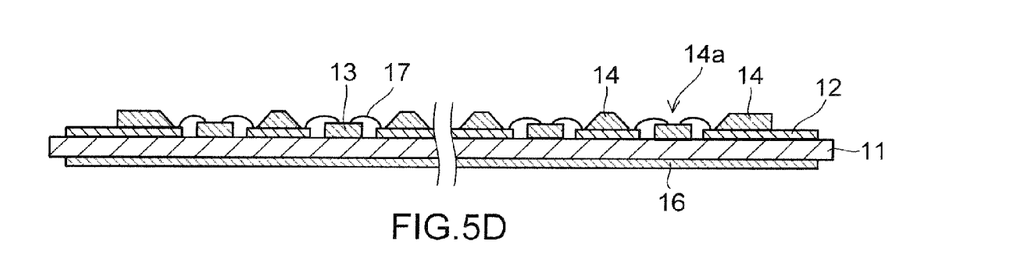

The element-mounting regions of the element-mounting substrate 11 exposed in the apertures 14a of the reflector 14 are then coated with a thermosetting resin adhesive by a dispense method. The LED elements 13 are then mounted on the adhesive using a chip mounter. One LED element 13 is accommodated in each respective aperture 14a. Heat treatment is then performed to set the adhesive. The electrode of each of the LED elements 13 and the conductor wiring 12 are then connected by the bonding wire 17 (FIG. 5D).

Figure 5E:
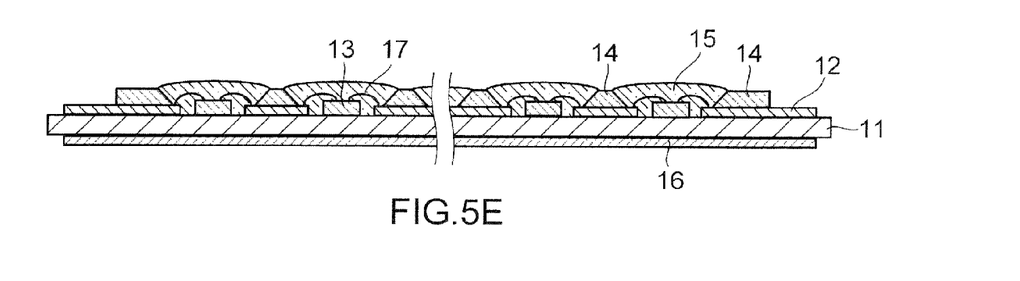

The encapsulation resin 15 composed of a phosphor-dispersed silicone resin is packed into each of the apertures 14a of the reflector 14 so as to bury the LED elements 13 and the bonding wire 17. Heat treatment is then performed to set the encapsulation resin 15. A YAG:Ce phosphor obtained by introducing Ce as an activator into YAG, for example, can be used as the phosphor. The encapsulation resin 15 may be an epoxy resin or a urethane resin (FIG. 5E).

The light-emitting device 10 is completed through the above steps.

Figure 6:
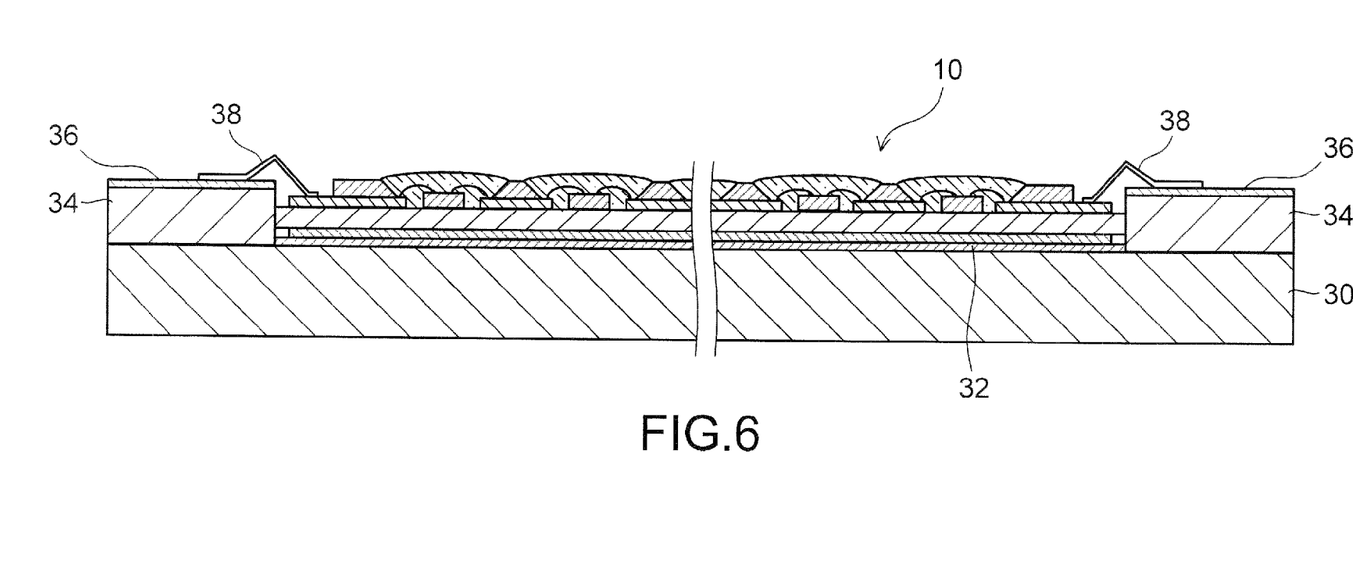
FIG. 6 is a cross-sectional view showing the packaged state of the light-emitting device according to an embodiment of the present invention.

FIG. 6 is a cross-sectional view showing the packaging embodiment of the light-emitting device 10. The light-emitting device 10 is packaged, for example, on a packaging substrate (i.e., light-emitting device mounting substrate) 30 constituting a luminaire. Here, the packaging substrate (or heat dissipation plate) includes a substrate used entirely for heat dissipation, regardless of the presence or absence of a circuit pattern. The packaging substrate 30 can be composed of, for example, Al having favorable heat conductivity, and is designed so that the heat generated from the LED elements 13 diffuses toward the packaging substrate 30. A bonding material 32 such as a heat dissipation sheet, silicone grease, or the other material having favorable heat conductivity can be provided between the rear surface glass 16 and the packaging substrate 30. Bonding properties between the packaging substrate 30 and the element-mounting substrate 11 is thereby improved, improving the heat dissipation properties.

A wiring substrate 34 composed of glass epoxy resin or the like is provided on the packaging substrate 30 so as to be adjacent to the light-emitting device 10. The wiring substrate 34 may have an aperture that allows the mounting regions of the light-emitting device 10 on the packaging substrate 30 to be exposed. Conductor wiring 36 for supplying power to the light-emitting device 10 is formed on the surface of the wiring substrate 34. A pair of connectors 38 extending toward the light-emitting device 10 are connected to the conductor wiring 36. The distal ends of the connectors 38 are in contact with the feeder terminals 12a, 12b, and form spring contacts for applying bias force for pressing the light-emitting device 10 against the packaging substrate 30. The light-emitting device 10 can thereby be supplied with power, and the joining between the light-emitting device 10 and the packaging substrate 30 is ensured.

As obvious from the above description, the light-emitting device 10 according to the present embodiment has a configuration in which a plurality of LED elements 13 are mounted on the element-mounting substrate 11, thereby allowing the distance between mutually adjacent LED elements to be reduced as compared with a configuration in which each of the LED packages having a single LED element is arrayed on the substrate. It is thereby possible to improve color mixture properties in cases in which a plurality of luminesent colors are mixed together.

The light-reflecting frame of the light-emitting device 10 according to the present embodiment is formed, and the light-emitting regions are defined, by the apertures 14a of the reflector 14 provided in correspondence with each of the LED elements 13. It is thereby possible to reduce the distance between the LED elements 13 and the light-reflecting frame. Accordingly, the difference in optical path length within the encapsulation resin 15 decreases between light transmitted in the vertical direction with respect to the light emission surface and light transmitted in a direction inclined with respect to the light emission surface, making it possible to suppress color irregularities in the luminescent colors and light absorption.

In the light-emitting device 10 according to the present embodiment, the rear surface glass 16 composed of a glass material having the same composition as the glass material forming the reflector 14 is provided to the rear surface of the element-mounting substrate 11. It is therefore possible to minimize or eliminate warping induced on the element-mounting substrate 11 due to the difference in the coefficient of thermal expansion between the reflector 14 and the element-mounting substrate 11. This effect is more prominent in high-flux light-emitting devices in which the surface area of the element-mounting substrate is comparatively large and a plurality of LED elements are mounted. Minimizing or eliminating warping of the element-mounting substrate 11 makes it possible to improve the bonding properties between the element-mounting substrate 11 and the packaging substrate 30, and to improve the heat dissipation properties. Not only is the luminous efficiency of the LED elements enhanced thereby, but the problem of a decrease in the service life of the LED elements is resolved. Uniform heat dissipation is ensured across the entire surface of the element-mounting substrate 11, and therefore brightness irregularities among the LED elements can be prevented. Improving the heat dissipation makes it possible for the distance between LED elements to be reduced further, contributing to further enhancement of color mixture properties. The glass film that forms the rear surface glass 16 has better affinity with the bonding material 32 such as silicone grease than the alumina ceramic that forms the element-mounting substrate 11. Specifically, by providing the rear surface glass 16 to the packaging surface of the light-emitting device 10, the bonding properties between the element-mounting substrate 11 and the packaging substrate 30 can be improved for two different reasons, that is, improved affinity between the rear surface glass 16 and the bonding material 32, in addition to the solution of warping of the element-mounting substrate 11.

Embodiment 2

Figure 7:
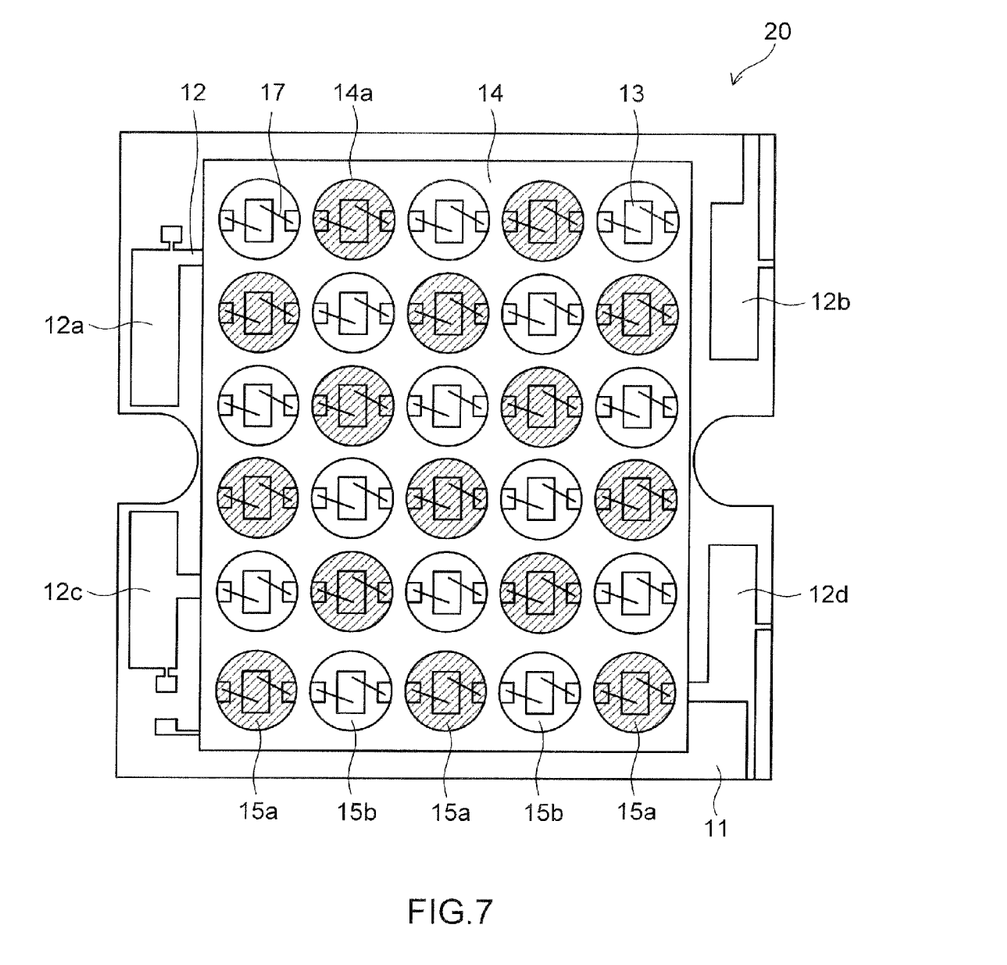
FIG. 7 is a plan view showing the structure of the light-emitting device according to another embodiment of the present invention.

A light-emitting device according to a second embodiment of the present invention is described below with reference to the drawings. FIG. 7 is a plan view of a light-emitting device 20 according to the second embodiment of the present invention, as seen from the light emission surface.

The light-emitting device 20 has the same basic configuration as the aforedescribed light-emitting device 10 according to the first embodiment, and includes an element-mounting substrate 11 having conductor wiring 12, a plurality of LED elements 13 mounted on the element-mounting surface of the element-mounting substrate 11, a reflector 14 having a plurality of apertures 14a for forming light-reflecting frame that surrounds the perimeter of each of the LED elements 13, phosphor-containing encapsulation resins 15a and 15b packed into each of the apertures 14a, and a rear surface glass 16 extending over substantially the entire rear surface of the element-mounting substrate 11.

The light-emitting device 20 is configured to generate two types of light having mutually different luminescent colors using the two types of encapsulation resins 15a and 15b containing phosphors having mutually different wavelength conversion characteristics. The two types of light are emitted from the light emission surface of the light-emitting device 20 to mix.

The reflector 14 has a plurality of apertures 14a arrayed in five rows by six columns corresponding to the state in which the LED elements 13 are arrayed. The apertures 14a form the light-reflecting frame surrounding the perimeter of each of the light-emitting elements, and define the light-emitting regions. The two types of encapsulation resin 15a and 15b containing phosphors having mutually different wavelength conversion characteristics are packed into the apertures 14a so as to be in the predetermined array. Part of the Y in the $Y_3Al_5O_{12}$ matrix of the phosphors is substituted by Gb, Tb, or the like, and part of the Al is substituted by Ga or the like, changing the matrix structure and thereby allowing the luminescence peak to be shifted to the longer wavelengths or the shorter wavelengths. For example, the first encapsulation resin 15a (shown by the cross-hatching in FIG. 7), which is designed for daylight colors, is packed into the apertures 14a, with alternate apertures skipped in the direction of the rows and in the direction of the columns. The second encapsulation resin 15b, which is designed for warm white colors, is packed into the remaining apertures 14a. Specifically, the first and second encapsulation resins 15a and 15b are arrayed so as to form staggered patterns. Such an array makes it possible to improve mixture properties of the luminescent color.

The conductor wiring 12 forms two circuit systems so as to make it possible for the quantity of light to be adjusted for each luminescent color. Specifically, the LED elements buried in the first encapsulation resin 15a and the LED elements buried in the second encapsulation resin 15b can be individually supplied with electricity via the conductor wiring 12. The feeder terminals 12a, 12b correspond to the anode terminal and the cathode terminal of the first system, and the feeder terminals 12c, 12d correspond to the anode terminal and the cathode terminal of the second system. This circuit configuration makes it possible for the luminescent colors to be adjusted between daylight colors and warm white colors. The conductor wiring 12 may be formed on the rear surface of the element-mounting substrate 11. In this case, the conductor wiring on the rear surface is connected to the conductor wiring of the element-mounting surface via a through-hole or the like.

In the embodiment described above, the LED elements and the conductor wiring are connected using bonding wire, but a flip-chip connection may also be used. The LED elements are also not limited to blue LEDs, and LEDs of any luminescent color may be used. The shape, size, and arraying of the reflector apertures can be modified as appropriate. Also, a plurality of LED elements may be accommodated within a single reflector aperture. In this case, the luminescent colors of the LED elements accommodated in the single aperture may be mutually different. The wavelength conversion characteristics of the phosphor may be selected as appropriate so as to obtain the desired luminescent color, and a phosphor-free encapsulation resin may also be used. The glass film that constitutes the reflector and the rear surface glass may be of a glass material other than borosilicate glass.

The present invention has been described above with reference to the preferred embodiments. It shall be understood that various changes and modifications can be envisaged by those skilled in the art. All examples of such changes and modifications are considered to be included in the appended claims.

Japanese Patent Application No. 2010-232429, which is the basis of the present application, is incorporated herein by reference.

What is claimed is:

1. A light-emitting device comprising:
    a plurality of light-emitting elements mounted on one surface of a substrate;
    a first glass film having a plurality of apertures that form a light-reflecting frame surrounding each of said plurality of light-emitting elements; and
    a second glass film provided to another surface of said substrate;
    wherein a coefficient of thermal expansion of said second glass film is greater than a coefficient of thermal expansion of said substrate when a coefficient of thermal expansion of said first glass film is greater than a coefficient of thermal expansion of said substrate, and a coefficient of thermal expansion of said second glass film is less than a coefficient of thermal expansion of said substrate when a coefficient of thermal expansion of said first glass film is less than a coefficient of thermal expansion of said substrate.

2. The light-emitting device of claim 1, wherein said first glass film and said second glass film are comprised of glass materials having the same coefficient of thermal expansion.

3. The light-emitting device of claim 1, wherein said first glass film and said second glass film are comprised of the same glass material.

4. The light-emitting device of claim 1, wherein an area in which said second glass film covers said substrate is larger than an area in which said first glass film covers said substrate.

5. The light-emitting device of claim 1, wherein the second glass film is formed on an entire region of said other surface of said substrate.

6. The light-emitting device of claim 1, having a feeder terminal on the surface of said substrate on which said light-emitting elements are mounted.

7. The light-emitting device of claim 1, wherein the thickness of said second glass film is less than the thickness of said first glass film.

8. The light-emitting device of claim 1, wherein said first glass film includes light-scattering particles.

9. The light-emitting device of claim 1, wherein a phosphor-containing resin is packed into said apertures.

10. The light-emitting device of claim 1, wherein said substrate is comprised of alumina ceramic.

11. The light-emitting device of claim 1, further including a packaging substrate joined to said second glass film via a bonding material.

* * * * *